United States Patent
Chen

(10) Patent No.: US 11,894,232 B2
(45) Date of Patent: Feb. 6, 2024

(54) METHODS FOR FORMING CHARGE LAYERS USING GAS AND LIQUID PHASE COATINGS

(71) Applicant: Applied Materials, Inc., Santa Clara, CA (US)

(72) Inventor: Taichou Papo Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/701,242

(22) Filed: Mar. 22, 2022

(65) Prior Publication Data
US 2023/0307235 A1    Sep. 28, 2023

(51) Int. Cl.
*H01L 21/223*     (2006.01)

(52) U.S. Cl.
CPC .................. *H01L 21/223* (2013.01)

(58) Field of Classification Search
CPC .......... H01L 21/22; H01L 21/2225; H01L 21/223–228; H01L 21/302–3088; H01L 21/322; H01L 21/324; H01L 21/38–388
See application file for complete search history.

(56) References Cited

U.S. PATENT DOCUMENTS 9,805,931 B2 * 10/2017 Sinclair ............. H01L 29/66795
11,227,768 B2 * 1/2022 Simmons .............. H01L 21/223

2010/0270635 A1 * 10/2010 Sickler .................. H01L 21/228
                                                                257/431
2012/0070953 A1 * 3/2012 Yu ....................... H01L 21/2236
                                                              257/E21.409
2015/0206751 A1    7/2015 Kato
2016/0260611 A1    9/2016 Consiglio et al.

FOREIGN PATENT DOCUMENTS

| CN | 113410134 A | 9/2021 |
|----|-------------|--------|
| JP | 2001-217196 A | 8/2001 |
| WO | WO 2019-150547 A1 | 8/2019 |

OTHER PUBLICATIONS

International Search Report and Written Opinion for PCT/US2023/015151, dated Jun. 30, 2023.
Shu Qin, Plasma Doping (PLAD) for Advanced Memory Device Manufacturing, ResearchGate, Jun. 2014, 7 pages, Gloucester, MA, USA.

* cited by examiner

*Primary Examiner* — Andres Munoz
(74) *Attorney, Agent, or Firm* — MOSER TABOADA

(57) ABSTRACT

Methods for adjusting a work function of a structure in a substrate leverage near surface doping. In some embodiments, a method for adjusting a work function of a structure in a substrate may include coating surfaces of the structure to form a doping layer in a non-solid phase that contains dopants on the surfaces of the structure and performing a dopant diffusion process using an oxidation process to drive the dopants through the surfaces the structure to embed the dopants in the structure to adjust the work function of the structure near the surfaces to form an abrupt junction profile and form an oxidation layer on the surfaces of the structure. The coating of the surfaces of the structure may be performed using a gas-phase or liquid-phase process.

20 Claims, 4 Drawing Sheets

METHODS FOR FORMING CHARGE LAYERS USING GAS AND LIQUID PHASE COATINGS

FIELD

Embodiments of the present principles generally relate to semiconductor processing of semiconductor substrates.

BACKGROUND

Structures, such as trenches, are often formed on substrates as part of constructing a semiconductor device. Bulk processing and high temperatures are typically used to alter the work function of the structures. However, the inventor has found that during such processes, the high temperatures may damage surrounding devices and also cause large charge gradients areas to be formed in the structures, reducing the area available for other device layers, causing a substantial decrease in performance.

Accordingly, the inventor has provided improved processes for forming charge layers that substantially increase performance and quantum efficiencies of structures without requiring surface modifications prior to performing the processes.

SUMMARY

Methods and structures for improved charge layers using gas phase and liquid phase coatings are provided herein.

In some embodiments, a method of adjusting a work function of a structure on a substrate may comprise coating surfaces of the structure to form a doping layer in a non-solid phase that contains dopants on the surfaces of the structure and performing a dopant diffusion process using an oxidation process to drive the dopants through the surfaces the structure to embed the dopants in the structure to adjust the work function of the structure near the surfaces to form an abrupt junction profile and form an oxidation layer on the surfaces of the structure.

In some embodiments, the method may further include wherein the oxidation process is a dry oxidation process, wherein the oxidation process is a wet oxidation process, the method performed without prior altering of a crystal formation of the surfaces of the structure, wherein the surfaces of the structure are coated using a gas-phase coating, wherein the surfaces of the structure are coated using a liquid-phase coating, the method performed at a temperature of less than 450 degrees Celsius, wherein the dopant diffusion process yields a charge in the surfaces of the structure of up to plus or minus approximately $1e16/cm^3$ to approximately $1e20/cm^3$, forming the structure using an etch process, forming a sacrificial oxide layer on surfaces of the structure with a dry oxide process at a temperature of less than approximately 450 degrees Celsius with a controllable oxidation thickness of approximately 1 nm to approximately 15 nm, and selectively removing the sacrificial oxide layer from surfaces of the structure prior to coating surfaces of the structure to form the doping layer, wherein the dry oxide process is performed in a plasma oxidation chamber, and/or etching the structure into the substrate to a high aspect ratio of greater than approximately 75:1.

In some embodiments, a method of adjusting a work function of a structure on a substrate may comprise coating surfaces of the structure with a plasma-based process to form a gas-phase doping layer that contains dopants on the surfaces of the structure and performing a dopant diffusion process using a dry oxidation process to drive the dopants through the surfaces of the structure to embed the dopants in the structure to adjust the work function of the structure near the surfaces and form an oxidation layer on the surfaces of the structure, wherein the dopant diffusion process is performed at less than approximately 450 degrees Celsius and forms a charge layer with an abrupt junction profile.

In some embodiments, the method may further include wherein the dopant diffusion process yields a charge in the surfaces of the structure of up to plus or minus approximately $1e16/cm^3$ to approximately $1e20/cm^3$, wherein the dopants are P-type or N-type, the method performed in a back-end-of-line (BEOL) process, the method performed without prior altering of a crystal formation of the surfaces of the structure, and/or forming the structure using an etch process, forming a sacrificial oxide layer on surfaces of the structure with a dry oxide process at a temperature of less than approximately 450 degrees Celsius with a controllable oxidation thickness of approximately 1 nm to approximately 15 nm, and selectively removing the sacrificial oxide layer from surfaces of the structure prior to coating surfaces of the structure to form the gas-phase doping layer.

In some embodiments, a non-transitory, computer readable medium having instructions stored thereon that, when executed, cause a method for adjusting a work function of a structure in a substrate to be performed, the method may comprise coating surfaces of the structure to form a doping layer in a non-solid phase that contains dopants on the surfaces of the structure and performing a dopant diffusion process using an oxidation process to drive the dopants through the surfaces the structure to embed the dopants in the structure to adjust the work function of the structure near the surfaces to form an abrupt junction profile and form an oxidation layer on the surfaces of the structure.

In some embodiments, the non-transitory, computer readable medium may have the method further including wherein the dopant diffusion process yields a charge in the surfaces of the structure of up to plus or minus approximately $1e16/cm^3$ to approximately $1e20/cm^3$ and forms the abrupt junction profile, and/or wherein the surfaces of the structure are coated using a gas-phase coating or a liquid-phase coating.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
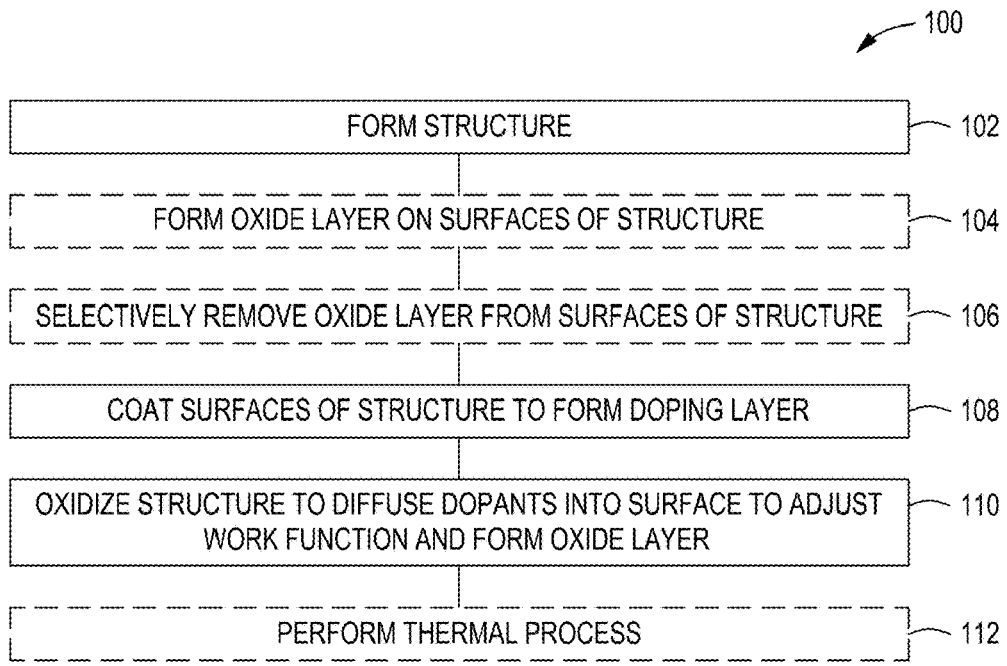
FIG. 1 is a method of adjusting a charge layer of surfaces of a structure in a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide a high-performance charge layer formation solution that dramatically increases charge manipulation capabilities in surfaces of structures. The methods provide innovative dopant and junction formation using gas-phase and liquid-phase processes with precise profile control without the thermal budget and surface condition constraints found in traditional processes. The techniques enable abrupt junction formation of charges near surfaces with ultra-high activated doping without crystal damage. In addition, the techniques allow use in back-end-of-line (BEOL) processes without thermal damage to existing structures on a substrate. The methods are also compatible with surfaces of high aspect ratio structures of greater than 50:1. The techniques of the present principles are capable of low to highly activated doping levels while maintaining the low thermal budgets of less than 450 degrees Celsius and while being insensitive to surface conditions. In addition, gas-phase processes allow for high conformality in high aspect ratio structures.

Figure 2A:
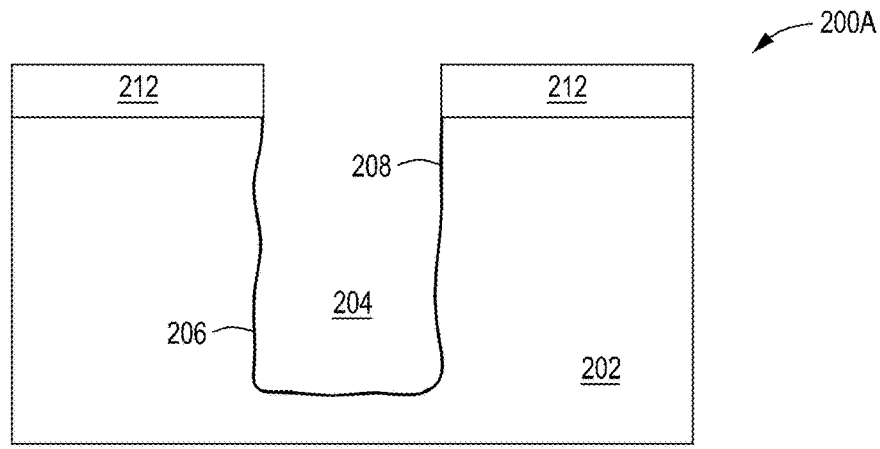
FIG. 2A depicts a cross-sectional view of a structure after an etching process in accordance with some embodiments of the present principles.

Although a trench is used as a 'structure' for the sake of brevity in the following examples, other structures may benefit from the methods of the present principles and, therefore, the use of a trench in the examples is not meant to be limiting. For example, the techniques of the present principles may also be used for planar structures as well. FIG. 1 is a method 100 of adjusting a charge layer or a work function of a structure 204 in a substrate 202 in accordance with some embodiments. In block 102, in some embodiments, an etching process, for example, forms the structure 204 into the substrate 202 as depicted in view 200A of FIG. 2A. The etching process typically uses a hardmask layer 212 that protects areas from the etching process. In some embodiments, the aspect ratio of the structure 204 is at least approximately 50:1. In some embodiments, the aspect ratio of the structure 204 is at least approximately 75:1. In some embodiments, the aspect ratio of the structure 204 is at least approximately 100:1. As a side effect of the etching process, damage 208 occurs to the surfaces 206 of the structure 204. The damage 208 may include crystal damage of the substrate material, contaminants or residue from the etching process, and/or dangling bonds of the substrate material and the like. The hardmask layer 212 is removed after the etching process is completed. The methods of the present principles have the advantage and capability to proceed directly onto damaged or unclean surfaces of the structure 204 (perform block 102 and go directly to block 108 of method 100). However, in the interest of completeness, the methods may also be performed on damage free and clean surfaces as described in the optional blocks 104 and 106.

Figure 2B:
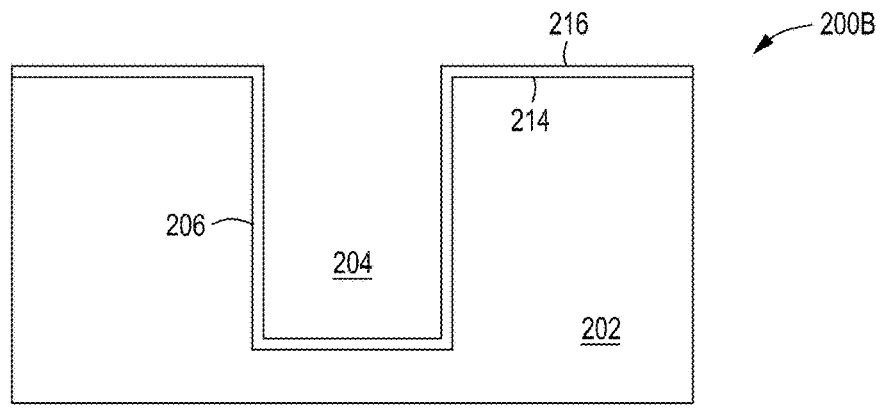
FIG. 2B depicts a cross-sectional view of a structure after an optional dry oxide process in accordance with some embodiments of the present principles.

In optional block 104, to further prepare the structure 204, in some embodiments, an oxide layer 216 is formed as a sacrificial layer on the substrate 202 using a dry oxidation process. As depicted in a view 200B of FIG. 2B, the field 214 or top surfaces of the substrate 202 and the surfaces 206 of the structure 204 undergo a dry oxidation process to form an oxide layer 216 that partially consumes the material of the substrate 202 including damaged portions. The dry oxidation process can be performed at temperatures of less than 450 degrees Celsius and produce less contamination and residue when compared to wet oxidation processes. In addition, dry oxidation processes can be used in substantially higher aspect ratio structures (e.g., greater than 100:1 aspect ratios) than wet oxidation (e.g., less than 50:1 aspect ratios). In some embodiments, the dry oxidation process is performed with a plasma oxidation chamber with or without a remote plasma source. The dry oxidation process facilitates in embedding oxygen into the surfaces 206 of the structure 204 to repair damage to the surfaces 206 and to reduce stress induced leakage current (SILO) and interface trap densities ($D_{it}$).

The dry oxidation process can also be controlled to provide different thicknesses of the oxide layer 216. Parameters such as exposure time, plasma density, temperature and the like can facilitate in determining an oxidation rate. The thickness is then controlled by the duration of the dry oxidation process. In conventional methods such as wet oxidation, the oxidizing process is self-limiting (wet oxidation process is self-terminating) and oxide layer thicknesses cannot be adjusted. Wet oxidation typically stops at 1 nm to 2 nm of thickness at the saturation point (self-limiting). Dry oxidation does not have a saturation point and is not self-limiting, allowing any level of thickness to be obtained. In some embodiments, the dry oxidation processes can achieve conformality in the structure 204 of greater than 95% for structures with an aspect ratio of greater than 100:1, enabling scaling of isolation structures using the present principles.

Figure 2C:
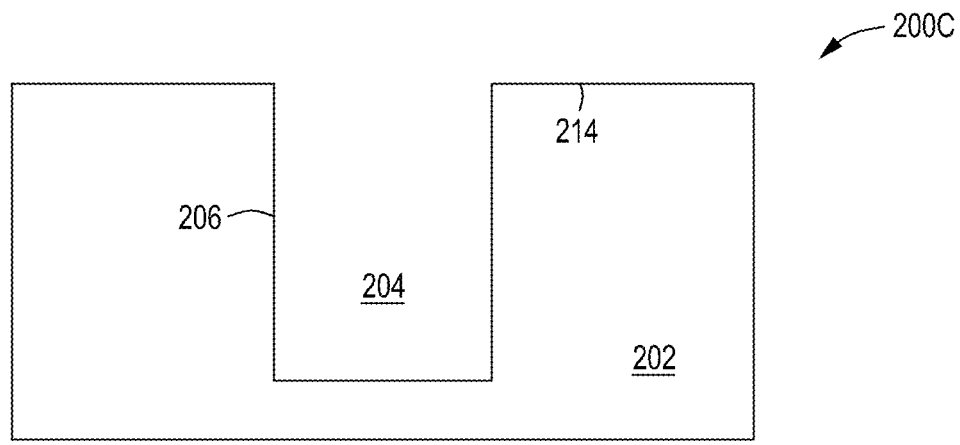
FIG. 2C depicts a cross-sectional view of a structure after an optional selective oxide removal process in accordance with some embodiments of the present principles.
Figure 2D:
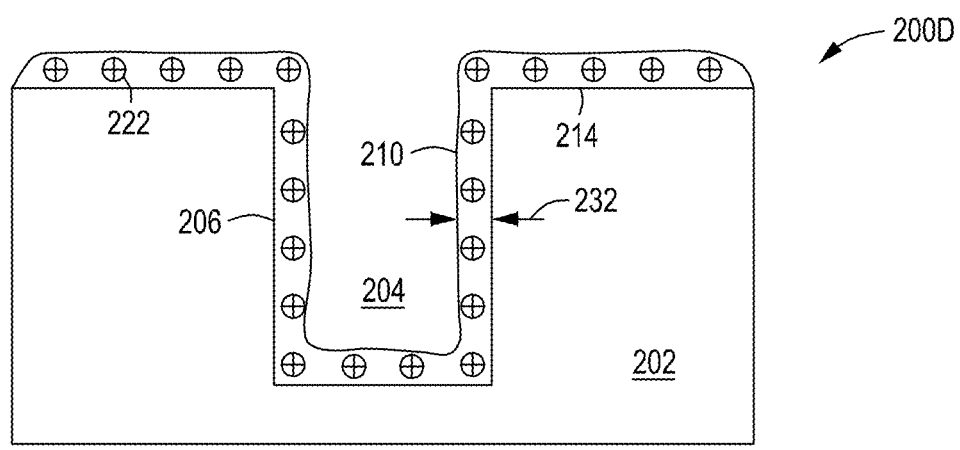
FIG. 2D depicts a cross-sectional view of a structure after forming a coating or doping layer in accordance with some embodiments of the present principles.

In optional block 106, in some embodiments, the oxide layer 216 is selectively removed from the surfaces 206 of the structure 204 and the field 214 of the substrate 202 as depicted in a view 200C of FIG. 2C. In some embodiments, plasma-based chambers can be used to selectively remove the oxide layer 216 with selectivity ratios of, for example, greater than 50:1 (e.g., oxide over Si or SiGe). The selective removal of the oxide layer 216 removes all of the oxide layer 216 without damaging any of the underlying material of the substrate 202 or creating contaminants/residue, leaving damage free and clean surfaces of the structure 204. In block 108, the surfaces 206 of the structure 204 are coated by using a gas-phase or liquid-phase process to form a doping layer 210 with dopants 222 on the surfaces of the structure 204 as depicted in a view 200D of FIG. 2D. As described previously, the coating and process is insensitive to surface conditions and may be applied to damaged or unclean surfaces of the structure 204 (e.g., surface 206 of FIG. 2A) as well as damage free and clean surfaces of the structure 204 (e.g., surface 206 of FIG. 2C).

The surface insensitivity of the process enables great flexibility without adding complexity to the process when not needed. In some embodiments, the gas-phase process may be performed by using a plasma-based process and a process gas to deposit the dopants 222 on the surfaces 206 of the structure 204. Gas-phase dopant deployment on the surfaces 206 are limited to subsequent dry oxidation processes for diffusing the dopants 222 into the surfaces 206. Gas-phase dopant deployment provides higher conformality on the surfaces 206, especially in high aspect ratio structures. Pressure may be adjusted to allow the gas-phase dopant to form on the surfaces with higher conformality as the pressure increases. In some embodiments, the liquid-phase process produces a wet layer of dopants 222 on the surfaces 206 of the structure 204. Liquid-phase dopant deployment on the surfaces 206 is compatible with subsequent dry oxidation processes and wet oxidation processes for diffusing the dopants 222 into the surfaces 206. The coating layer or doping layer 210 of the surfaces 206 may have a thickness 232 of less than one nanometer and down to an atomic layer thickness.

The species of dopants 222 (P-type species shown but not meant to be limiting) may be incorporated to form a positive charge or a negative charge (e.g., silicon doped with boron, gallium, phosphor, arsenic, etc.) on the substrate 202. The density of the dopants 222 and/or the type of the dopants 222 may be adjusted to provide a given plus or minus charge level as required for the structure 204. In block 110, the structure 204 is oxidized to diffuse the dopants 222 into the surfaces 206 to adjust the work function of the structure 204 and to form an oxide layer. A work function of the structure 204 is adjusted by varying dopant densities, dopant types, and dopant depths. The density of the dopants 222 and/or the type of the dopants 222 may be adjusted to provide a given plus or minus charge level as required for the structure 204 and a given work function. A higher work function near a surface can facilitate or increase the carrier mobility inside of an adjacent structure such as a pixel structure and reduce the sensitivity to the surface recombination. The above techniques allow for substantial flexibility in engineering the work function through dopant depth, density, and type adjustments while increasing adjacent structure area by using abrupt junction profiles.

Figure 2E:
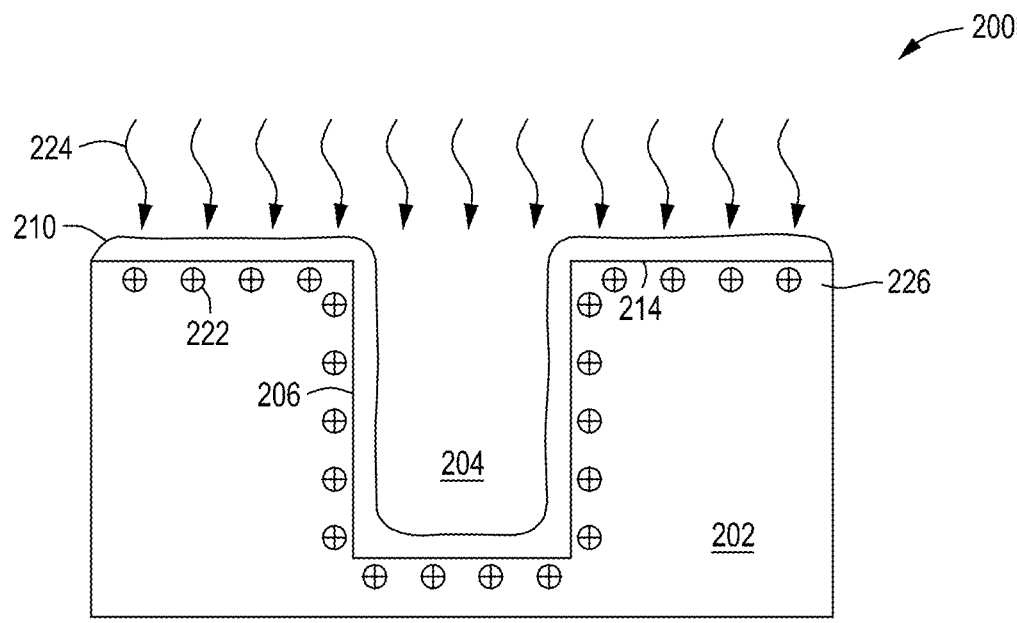
FIG. 2E depicts a cross-sectional view of a structure after oxidation in accordance with some embodiments of the present principles.
Figure 2F:
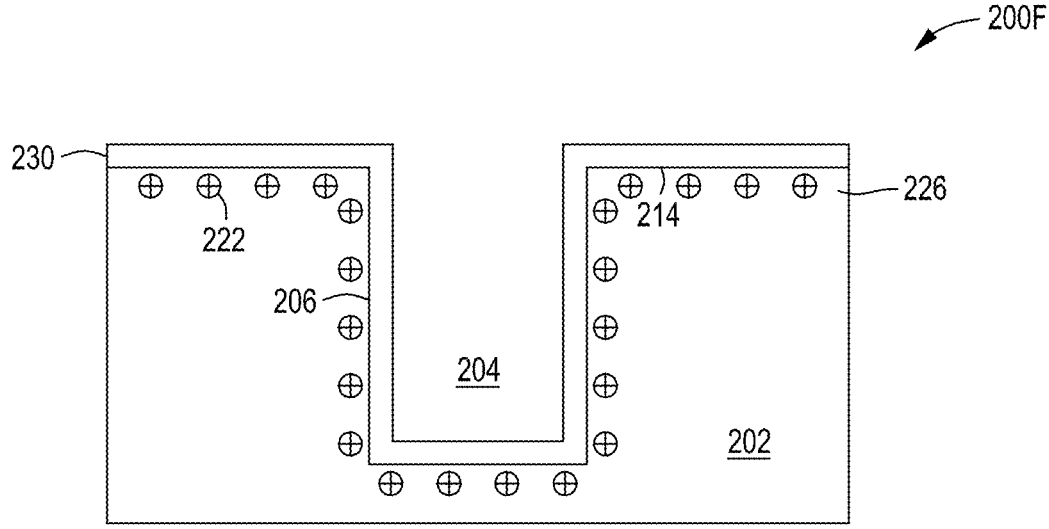
FIG. 2F depicts a cross-sectional view of a structure after formation of an oxide layer in accordance with some embodiments of the present principles.

After deposition of the dopants using gas-phase or liquid-phase processes, a dopant diffusion process 224 is performed on the structure 204 as depicted in a view 200E of FIG. 2E. In some embodiments, the dopant diffusion process 224 may be a dry oxidation process performed in a plasma oxidation chamber and the like. The dry oxidation process is compatible with gas-phase and liquid-phase processes for diffusion of dopants into the surfaces 206 of the structure 204. In some embodiments, the dopant diffusion process 224 may be a wet oxidation process which is compatible with liquid-phase processes for diffusion of dopants into the surfaces 206 of the structure 204. In effect, the doping layer 210 produces a liner layer 230 and an embedded charge layer 226 without an anneal process as depicted in a view 200F of FIG. 2F.

The dopant diffusion process 224 yields an abrupt charge boundary or abrupt junction profile or abrupt composition transition in the material of the substrate 202 that increases the effective area of an adjacent structure (e.g., a pixel structure area, etc.) as opposed to conventional techniques that form a gradient charge region that requires more area to be used adjacent to the structure, reducing performance of adjacent structures. As used herein, an abrupt junction, by definition, is a junction in which the doping concentration changes over a very small distance from a surface compared to the spatial extent into which the doping could be diffused. In some embodiments, the charge layer 226 may have a charge formation of up to plus or minus approximately 1e16/cm$^3$ to approximately 1e20/cm$^3$ depending on permitted temperature and pressure. The charge layer 226 of the present principles can achieve a level of activation as processed without the need of any post activation treatment.

In optional block 112, an additional back end of line (BEOL) compatible thermal or anneal process may be performed after oxidation. In some embodiments, the above processes may be performed without an air break to prevent surface impurities, contaminants, and/or particle generation.

Figure 3:
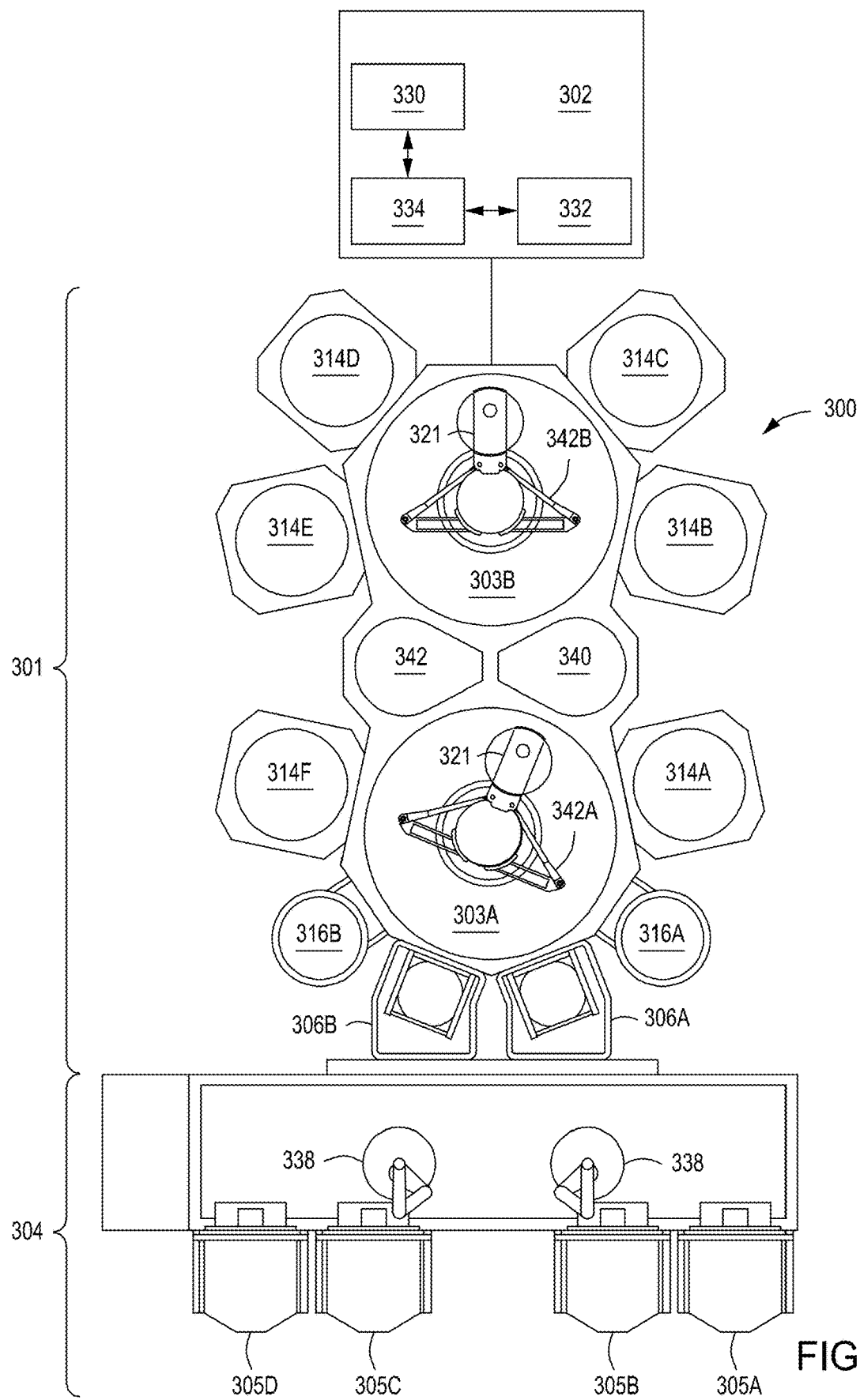
FIG. 3 depicts an integrated tool in accordance with some embodiments of the present principles.

The methods described herein may be performed in individual process chambers that may be provided in a standalone configuration or as part of a cluster tool, for example, an integrated tool 300 (i.e., cluster tool) described below with respect to FIG. 3. The advantage of using an integrated tool 300 is that there is no vacuum break and, therefore, no requirement to degas and pre-clean a substrate before treatment in a chamber. For example, in some embodiments the inventive methods discussed above may advantageously be performed in an integrated tool such that there are limited or no vacuum breaks between processes, limiting or preventing contamination of the substrate. The integrated tool 300 includes a vacuum-tight processing platform 301, a factory interface 304, and a system controller 302. The processing platform 301 comprises multiple processing chambers, such as 314A, 313B, 314C, 314D, 314E, and 314F operatively coupled to a vacuum substrate transfer chamber (transfer chambers 303A, 303B). The factory interface 304 is operatively coupled to the transfer chamber 303A by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 3. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303A. The load lock chamber 306A and 306B are coupled to a pressure control system (not shown) which pumps down and vents the load lock chambers 306A and 306B to facilitate passing the substrates between the vacuum environment of the transfer chamber 303A and the substantially ambient (e.g., atmospheric) environment of the factory interface 304. The transfer chambers 303A, 303B have vacuum robots 342A, 342B disposed in the respective transfer chambers 303A, 303B. The vacuum robot 342A is capable of transferring substrates 321 between the load lock chamber 306A, 306B, the processing chambers 314A and 314F and a cooldown station 340 or a pre-clean station 342. The vacuum robot 342B is capable of transferring substrates 321 between the cooldown station 340 or pre-clean station 342 and the processing chambers 314B, 314C, 314D, and 314E.

In some embodiments, the processing chambers 314A, 314B, 314C, 314D, 314E, and 314F are coupled to the transfer chambers 303A, 303B. The processing chambers 314A, 314B, 314C, 314D, 314E, and 314F may comprise, for example, an atomic layer deposition (ALD) process chamber, a physical vapor deposition (PVD) process chamber, chemical vapor deposition (CVD) chambers, annealing chambers, or the like. The chambers may include any chambers suitable to perform all or portions of the methods described herein, as discussed above, such as a dry oxide removal chamber or pre-clean chamber and etching and deposition chambers. In some embodiments, one or more optional service chambers (shown as 316A and 316B) may be coupled to the transfer chamber 303A. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, 314D, 314E, and 314F or alternatively, by controlling the computers (or controllers) associated with the process chambers 314A, 314B, 314C, 314D, 314E, and 314F and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general-purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller) 302. The software routines may also be stored and/or executed by a second controller (not shown) that is located remotely from the tool 300.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of adjusting a work function of a structure on a substrate, comprising:
coating surfaces of the structure to form a doping layer in a non-solid phase that contains dopants on the surfaces of the structure, wherein the structure has an aspect ratio of at least 50:1; and
performing a dopant diffusion process using an oxidation process to drive the dopants through the surfaces the structure to embed the dopants in the structure to adjust the work function of the structure near the surfaces to form an abrupt junction profile and form an oxidation layer on the surfaces of the structure.

2. The method of claim 1, wherein the oxidation process is a dry oxidation process.

3. The method of claim 1, wherein the oxidation process is a wet oxidation process.

4. The method of claim 1 is performed without prior altering of a crystal formation of the surfaces of the structure.

5. The method of claim 1, wherein the surfaces of the structure are coated using a gas-phase coating.

6. The method of claim 1, wherein the surfaces of the structure are coated using a liquid-phase coating.

7. The method of claim 1 is performed at a temperature of less than 450 degrees Celsius.

8. The method of claim 1, wherein the dopant diffusion process yields a charge in the surfaces of the structure of approximately $1e16/cm^3$ to approximately $1e20/cm^3$.

9. The method of claim 1, further comprising:
forming the structure using an etch process;
forming a sacrificial oxide layer on surfaces of the structure with a dry oxide process at a temperature of less than approximately 450 degrees Celsius with a controllable oxidation thickness of approximately 1 nm to approximately 15 nm; and
selectively removing the sacrificial oxide layer from surfaces of the structure prior to coating surfaces of the structure to form the doping layer.

10. The method of claim 9, wherein the dry oxide process is performed in a plasma oxidation chamber.

11. The method of claim 9, further comprising:
etching the structure into the substrate to a high aspect ratio of greater than approximately 75:1.

12. A method of adjusting a work function of a structure on a substrate, comprising:
coating surfaces of the structure with a plasma-based process to form a gas-phase doping layer that contains dopants on the surfaces of the structure; and
performing a dopant diffusion process using a dry oxidation process to drive the dopants through the surfaces of the structure to embed the dopants in the structure to adjust the work function of the structure near the surfaces and form an oxidation layer on the surfaces of the structure, wherein the dopant diffusion process is performed at less than approximately 450 degrees Celsius and forms a charge layer with an abrupt junction profile.

13. The method of claim 12, wherein the dopant diffusion process yields a charge in the surfaces of the structure of up to plus or minus approximately $1e16/cm^3$ to approximately $1e20/cm^3$.

14. The method of claim 12, wherein the dopants are P-type or N-type.

15. The method of claim 12 is performed in a back-end-of-line (BEOL) process.

16. The method of claim 12 is performed without prior altering of a crystal formation of the surfaces of the structure.

17. The method of claim 12, further comprising:
forming the structure using an etch process;
forming a sacrificial oxide layer on surfaces of the structure with a dry oxide process at a temperature of less than approximately 450 degrees Celsius with a controllable oxidation thickness of approximately 1 nm to approximately 15 nm; and
selectively removing the sacrificial oxide layer from surfaces of the structure prior to coating surfaces of the structure to form the gas-phase doping layer.

18. A non-transitory, computer readable medium having instructions stored thereon that, when executed, cause a method for adjusting a work function of a structure in a substrate to be performed, the method comprising:
coating surfaces of the structure to form a doping layer in a non-solid phase that contains dopants on the surfaces of the structure; and
performing a dopant diffusion process using an oxidation process to drive the dopants through the surfaces the structure to embed the dopants in the structure to adjust the work function of the structure near the surfaces to form an abrupt junction profile and form an oxidation layer on the surfaces of the structure.

19. The non-transitory, computer readable medium of claim 18, wherein the dopant diffusion process yields a charge in the surfaces of the structure of approximately $1e16/cm^3$ to approximately $1e20/cm^3$ and forms the abrupt junction profile.

20. The non-transitory, computer readable medium of claim 18, wherein the surfaces of the structure are coated using a gas-phase coating or a liquid-phase coating.

\* \* \* \* \*

UNITED STATES PATENT AND TRADEMARK OFFICE
CERTIFICATE OF CORRECTION

PATENT NO. : 11,894,232 B2
APPLICATION NO. : 17/701242
DATED : February 6, 2024
INVENTOR(S) : Taichou Papo Chen Page 1 of 1

It is certified that error appears in the above-identified patent and that said Letters Patent is hereby corrected as shown below:

In the Claims

In Column 8, Lines 37-38, Claim 13, delete "up to plus or minus"

Signed and Sealed this
Twenty-sixth Day of November, 2024

Katherine Kelly Vidal
*Director of the United States Patent and Trademark Office*